United States Patent
Nassoura

(10) Patent No.: US 11,221,662 B1
(45) Date of Patent: Jan. 11, 2022

(54) AUTOMATICALLY BUDGETING POWER FOR DATA CENTER EQUIPMENT

(71) Applicant: Sunbird Software, Inc., Somerset, NJ (US)

(72) Inventor: Samer Yousef Nassoura, Madison, NJ (US)

(73) Assignee: Sunbird Software, Inc., Somerset, NJ (US)

( * ) Notice: Subject to any disclaimer, the term of this patent is extended or adjusted under 35 U.S.C. 154(b) by 0 days.

(21) Appl. No.: 17/086,569

(22) Filed: Nov. 2, 2020

Related U.S. Application Data

(60) Provisional application No. 62/930,126, filed on Nov. 4, 2019.

(51) Int. Cl.
*G06F 1/00* (2006.01)
*G06F 1/3206* (2019.01)

(52) U.S. Cl.
CPC .................................. *G06F 1/3206* (2013.01)

(58) Field of Classification Search
CPC .................................................... G06F 1/3206
See application file for complete search history.

(56) References Cited

U.S. PATENT DOCUMENTS

| | | | | |
|---|---|---|---|---|
| 2005/0283624 A1* | 12/2005 | Kumar | ................. | G06F 1/3203 |
| | | | | 713/300 |
| 2008/0244281 A1* | 10/2008 | Felter | ...................... | G06F 1/28 |
| | | | | 713/300 |
| 2009/0089595 A1* | 4/2009 | Brey | ..................... | G06F 1/3203 |
| | | | | 713/300 |
| 2013/0226362 A1* | 8/2013 | Jagadishprasad | ..... | G06F 9/5094 |
| | | | | 700/297 |

* cited by examiner

*Primary Examiner* — Nitin C Patel
(74) *Attorney, Agent, or Firm* — McGeary Cukor LLC; Vincent McGeary

(57) ABSTRACT

A system and method according to the principles of the invention provides the data center operator enhanced tools for managing power capacity. The system tracks and stores actual power usage to the item level and automatically adjusts the budgeted power for items, groups of items and item models. The disclosed system and method finds stranded power capacity by adjusting power budgets according to actual usage trends. Operators can implement auto power budget adjustments based on configured policies. The policies can include specifying the power budget headroom for items, groups of items and models.

10 Claims, 8 Drawing Sheets

FIG. 8

AUTOMATICALLY BUDGETING POWER FOR DATA CENTER EQUIPMENT

CROSS REFERENCE TO RELATED APPLICATIONS

This application claims the benefit of U.S. Provisional Patent Application 62/930,126, filed Nov. 4, 2019, which application is incorporated by reference as set forth in its entirety. If there is any disagreement between the language in the provisional and this application, the language in this application prevails.

FIELD OF THE INVENTION

The present invention relates generally to the field of data center infrastructure management (DCIM) and more particularly to the field of budgeting power capacity for data center equipment.

BACKGROUND OF THE INVENTION

A data center is a facility used to house computer systems or servers and associated components, such as network communications and storage systems. It generally includes redundant or backup power supplies, redundant data communications connections, environmental controls (e.g., air conditioning, fire suppression) and various security devices. The networked computer servers are used by organizations for processing, storage, and distribution of large amounts of data. In recent years, data centers have evolved significantly, improving efficiency and increasing scale to adopt technologies such as virtualization, cloud computing, mobile applications and Internet of Things applications.

Conventionally, the computer servers are mounted in racks and supplied with power through a power distribution system. The power distribution system includes a mains power supply that serves as the source of electrical power within the data center and distributes power to one or more floor PDUs. A floor PDU has one or more power panels comprising circuit breakers, in which each circuit breaker is electrically connected to cabling leading to a power outlet that adjoins (e.g., is underneath, is above, etc.) a rack cabinet.

Each rack PDU associated with a rack cabinet is electrically connected to the cabinet power outlet and is supplied with line power from the power outlet. The rack PDU provides the line power to the power supplies of various electronic devices that are mounted in a rack or computer cabinet to which the rack PDU is also mounted. The rack PDU has a plurality of female line-voltage receptacles, or "outlets," for supplying line power to, for example, the computer servers, modems, and routers that are mounted in the rack.

Rack PDUs can monitor the power drawn from each power outlet, in that they have "outlet level" power monitoring or metering. Having this monitoring makes it possible to, for example, determine the power being drawn by a particular computer server or other device.

Data Center Management refers to the role of individuals (data center managers) tasked within a data center to oversee technical and information technology (IT) issues. This includes managing computer and server operations, managing large amounts of data, managing and providing services and applications, and protecting and securing the data. While some of these tasks must be directly managed, many can be automated, thereby reducing the number of on-site employees, eliminating unnecessary manual tasks and reducing associated business costs.

Data center managers require tools that provide resiliency, improve uptime, and reduce risk across the data center infrastructure—including network, power, IT equipment, applications software, and applications services. Data Center Infrastructure Management (DCIM) tools dramatically simplify data center management by giving data center operators the ability to run efficient data center operations and improve data center infrastructure planning and design.

There exist systems and methods for providing various levels of data center infrastructure management. Sunbird Software, Inc. of Somerset, N.J., for example, provides software solutions for DCIM. These solutions provide data center operations managers with the ability to identify, locate, visualize, and manage all physical data center assets, quickly provision new equipment, and confidently plan capacity for future growth. DCIM tools can also help control energy costs, improve data center design, and increase operational efficiency.

One aspect of data center management involves managing power. Systems and methods exist to monitor power consumption along each link of the power chain for a well-equipped data center. These links include the main power supply, the uninterruptible power supply, the circuit breaker, the power distribution units (floor and rack) and the servers in the rack. U.S. Pat. No. 8,429,431, incorporated herein by reference, discloses a system and method for achieving power management in a data center.

It is known that data centers are often over-provisioned and excess capacity typically exists, in part due to nameplate specifications recommending excess capacity for particular classes and pieces of equipment. U.S. patent application Ser. No. 15/633,577, entitled, "System and Method for Configuring Equipment That is Reliant on a Power Distribution System," describes various aspects of configuring power in a data center and is incorporated herein by reference in its entirety. However, even with existing DCIM tools data center managers have limited ability to find stranded capacity.

A need exists for a system and method capable of easily measuring actual power usage to the power outlet level and above, and comparing the actual usage to the budgeted usage. A need further exists to easily adjust budgeted power for all items in the data center so that budgeted power and actual power align such that the data center manager know with precision how much excess capacity exists.

SUMMARY OF THE INVENTION

A system and method according to the principles of the invention enables the management and visualization of data center assets, particularly with regard to configuring how electrical power is budgeted to one or more rack-mounted devices, such as computer servers.

A method according to the principles of the invention incudes storing in a database, by a data-processing system, power budgets for identified items in a data center; receiving, by the data-processing system, actual power readings for at least one of the items according to configured criteria; evaluating, by the data-processing system, the actual power readings according to a configured policy; adjusting, by the data-processing system, the power budgets for at least one of the items; when the at least one of the items in the adjusting step includes a plurality of items, grouping, by the data-processing system, the plurality of items by model; aggregating, by the data-processing system, the adjusted power budget values by group; storing, by the data-processing system, the adjusted power budgets and the aggregated power budgets; and displaying on a video display, by the data-processing system, values indicative of differences between adjusted power budgets and power budgets.

A system and method according to the principles of the invention provides the data center operator enhanced tools for managing power capacity. The system tracks and stores actual power usage to the item level and automatically adjusts the budgeted power for items, groups of items and item models. The disclosed system and method finds stranded power capacity by adjusting power budgets according to actual usage trends. Operators can implement auto power budget adjustments based on configured policies. The policies can include specifying the power budget headroom for items, groups of items and models.

In an exemplary embodiment, rack PDU's provide actual power usage to the outlet level so that the operator can retrieve power usage data for the entire power chain to a rack or item. Policy details apply to each item or model and, with the disclosed system and method. In an embodiment, operators can exclude from auto power budgeting server based on selected criteria, such as whether the server runs a particular application.

In another embodiment, auto power budgeting permits the operator to configure new servers based on historic power budget adjustments. For example, a particular server can be configured with a power budget based on the server model as adjusted rather than on the nameplate specification. These and other features will be understood by the ordinarily skilled artisan after reading this disclosure.

BRIEF DESCRIPTION OF THE DRAWINGS

FIG. 8 an interactive interface 800 for providing inputs and for receiving information relative to the system and method of the invention.

DETAILED DESCRIPTION

Figure 1:
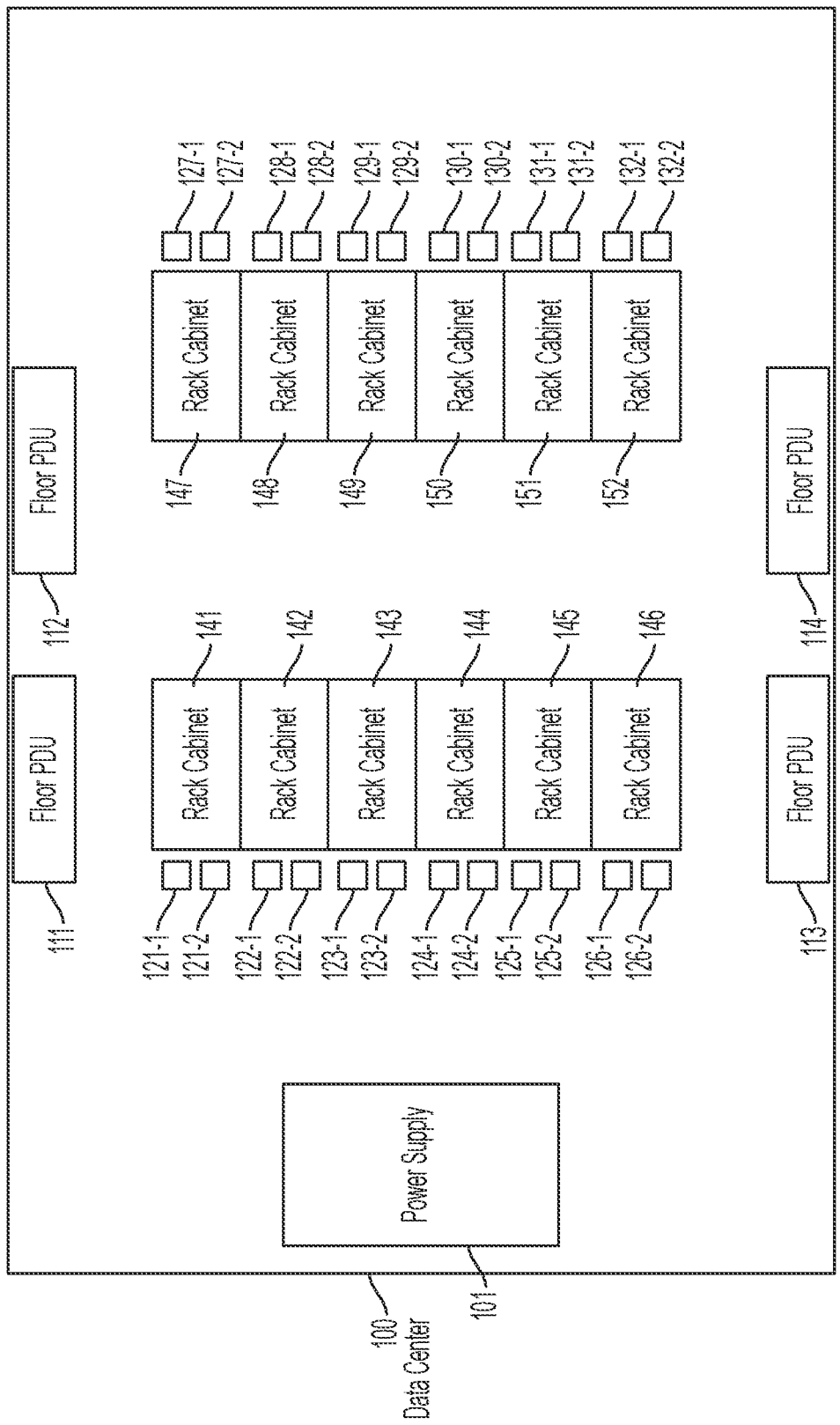
FIG. 1 depicts a floor plan of at least some of the equipment constituting data center 100.

FIG. 1 depicts a floor plan of at least some of the equipment constituting data center 100, in accordance with an illustrative embodiment of the present invention. Data center 100 is a facility that is used to house computer systems and associated components. As depicted, data center 100 comprises mains power supply 101, floor-mounted power distribution units 111 through 114, cabinet power outlets 121-$h$ through 132-$h$, wherein h as depicted has a value of 1 or 2, and equipment rack cabinets 141 through 152, situated as shown. Data center 100 further comprises data communications connections, environmental controls such as air conditioning and fire suppression, and security devices, which for clarity purposes are not depicted in FIG. 1.

For simplicity, FIG. 1 shows one mains power supply, four floor-mounted power distribution units, and twelve rack cabinets in data center 100. In actuality, a data center routinely comprises thousands of servers. Additionally, FIG. 1 does not depict the electrical-power connectivity between the depicted elements, which connectivity is well known and can be made and used by persons having skill in the art. And as those who are skilled who are skilled in the art will appreciate after reading this specification, other equipment units can be present through which electrical power flows, in addition to or instead of at least some of the depicted elements.

Mains power supply 101 is an electrical apparatus that receives electrical power from an external source, also known as "mains power," and makes the power available to various electrical equipment within data center 100. In some embodiments of the present invention, power supply 101 can provide an uninterruptible power supply (UPS) function, which is used to provide emergency power to the equipment within data center 100 when the mains power source fails. Power supply 101 can also be used to protect the electrical equipment within data center 100 from unexpected power disruption.

Floor-mounted power distribution units (PDU) 111, 112, 113, and 114 each distributes electrical power received from power supply 101 to one or more rack cabinets, such as rack cabinets 141 through 152. For example, floor PDU 111 receives power from power supply 101 and transforms the raw power feed into any number of lower capacity, distributed power feeds. Floor PDU 111 can require multiple high-current circuits possibly from different electrical phases of incoming power from supply 101. Each floor PDU can comprise main breakers, individual circuit breakers, and power monitoring panels.

FIG. 1 depicts floor-based power distribution in the form of floor PDUs 111 through 114. As those who are skilled in the art will appreciate after reading this specification, floor-based power distribution can be in the form of other equipment units such as, while not being limited to, a power distribution rack (PDR), a remote power panel (RPP), and so on, which can be present in addition to or instead of some or all of the depicted floor PDUs.

Rack cabinets 141 through 152 are enclosures for mounting multiple electronic equipment units, which are also referred to as "devices." Each rack cabinet is also referred to as a "rack", in particular where the cabinet comprises a standardized frame for mounting the multiple units. Rack cabinets 141 and 142 as described in detail below and in regard to FIG. 2.

Each rack cabinet depicted in FIG. 1 houses one or more rack PDUs. A rack PDU distributes electrical power received from a floor-mounted PDU, such as floor PDUs 111 through 114, to one or more devices that are mounted within the rack cabinet. For example, a rack PDU is fitted with multiple electrical outlets that are designed to provide power to units within the host rack cabinet. (The terms "electrical outlet" and "power outlet" are used interchangeably throughout this specification.)

The rack PDUs that are associated with a rack cabinet receive their power through one or more power outlets that are associated with each cabinet. As depicted in FIG. 1, cabinet power outlets 121-*h* through 132-*h* are associated with rack cabinets 141 through 152, respectively. Each cabinet power outlet, also known as a "whip," is electrically connected to a floor PDU and, as such, receives electrical power from that floor PDU. A cabinet power outlet can be situated above (i.e., in or near the ceiling) or below (i.e., in or near the floor) its corresponding rack cabinet. A rack PDU is electrically connected to the power outlet that is providing power to that rack PDU.

One or more of the depicted rack cabinets further comprise one or more computer servers, also referred to as "servers." A server is a device that provides functionality to other devices, such as clients that are not part of data center 100 but which exchange information with programs being executed by the server. Each server mounted within rack cabinets 141 through 152 can provide one or more functionalities such as database, file storage, email, printing web, gaming, and applications functionality, for example and without limitation. One or more of the depicted rack cabinets can comprise types of electronic devices other than or in addition to servers and rack PDUs.

Figure 2:
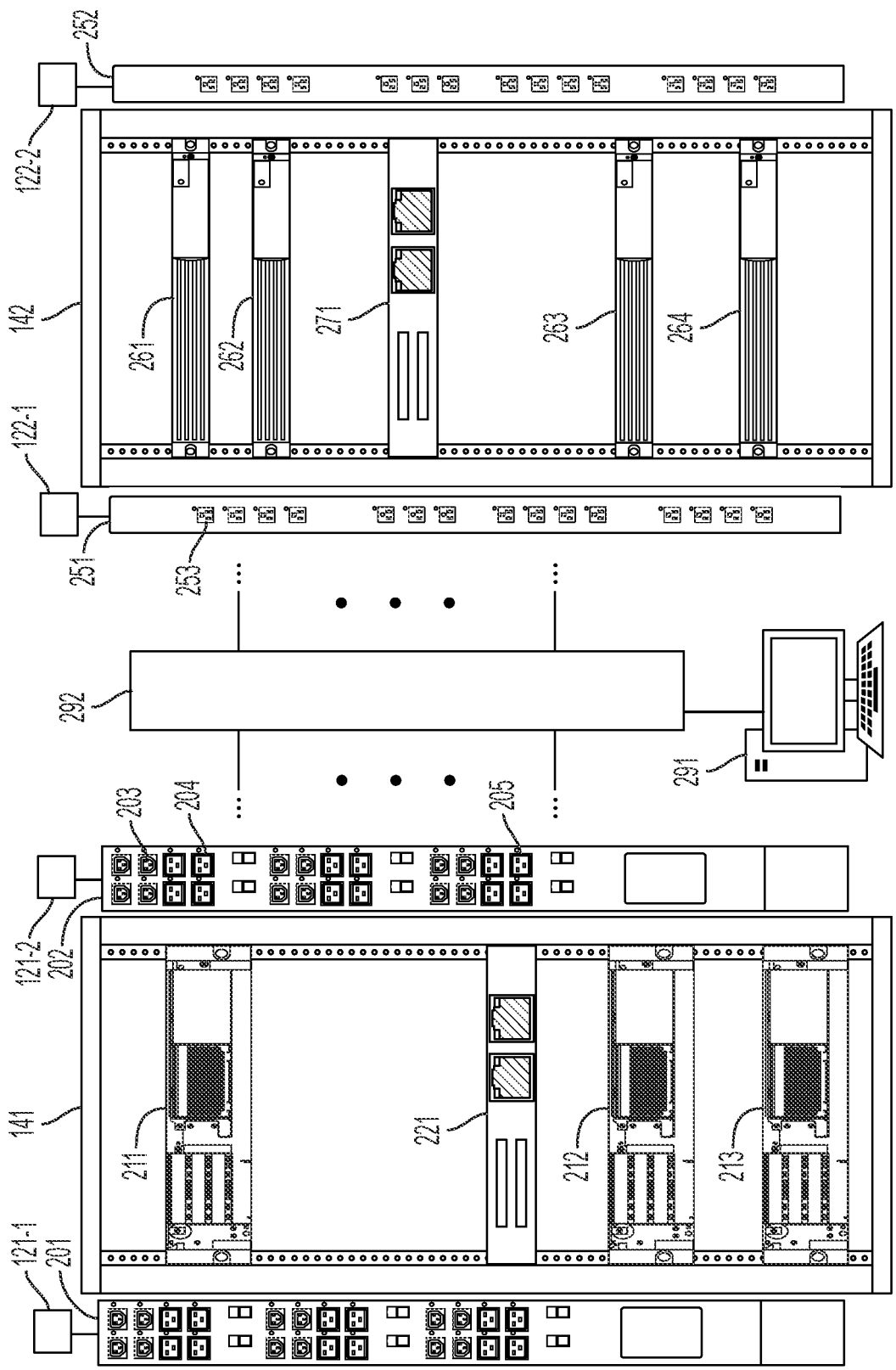
FIG. 2 depicts an equipment diagram of rack cabinets 141 and 142, and also at least some of the equipment associated with these cabinets, including asset management system 291.

FIG. 2 depicts an equipment diagram of rack cabinets 141 and 142, and also at least some of the equipment associated with these cabinets, in accordance with the illustrative embodiment. As depicted, associated with rack cabinet 141 are rack PDUs 201 and 202, servers 211, 212, and 213, and power monitoring appliance 221, all of which are mounted near or within cabinet 141. Additionally, associated with cabinet 142 are rack PDUs 251 and 252, servers 261, 262, 263, and 264, and power monitoring appliance 271, all of which are mounted near or within cabinet 142. Also associated with rack cabinets 141 and 142 are asset management system 291 and local-area network 292, interconnected to each other as shown.

One or both of rack PDUs 201 and 202, which are mounted to rack 141, supply power to each of servers 211, 212, and 213 and to power-monitoring appliance 221, described in more detail below. For clarity purposes, FIG. 2 depicts the rack PDUs as being separate from the rack cabinets to which they are mounted and does not depict the power cabling between each rack device and a power outlet on a rack PDU.

Rack PDUs 201 and 202 are each fitted with multiple electrical outlets designed to provide power to devices within rack cabinet 141. For example, PDU 202 is fitted with outlets 203, 204, and 205, as well as others. Rack PDUs 201 and 202 each is capable of outlet-level power monitoring and switching capability, and, therefore, can measure and report the individual power consumption of each of servers 211, 212, and 213, and appliance 221.

Rack PDUs 201 and 202 themselves are electrically connected to cabinet power outlets 121-1 and 121-2, respectively, which outlets provide electrical power to those rack PDUs. Each of rack PDUs 201 and 202 is capable of input power monitoring and, therefore, can measure and report the power that it draws from the upstream power chain that it is part of.

Similarly, one or both of PDUs 251 and 252 supply power to each of servers 261, 262 and 263, and 264, and also to power-monitoring appliance 271. Rack PDUs 251 and 252 are each fitted with multiple electrical outlets designed to provide power to devices within rack cabinet 142, including outlet 253 of PDU 251 as an example. Rack PDUs 251 and 252 each is capable of outlet-level power monitoring and switching capability, and, therefore, can measure and report the individual power consumption of each of servers 261, 262, 263, and 264, and appliance 271. PDUs 251 and 252 can be, but need not be, the same as PDUs 201 and 202. For that matter, 251 and 252 need not be identical to each other.

Rack PDUs 251 and 252 themselves are electrically connected to cabinet power outlets 122-1 and 122-2, respectively, which outlets provide electrical power to those rack PDUs. As are PDUs 201 and 202, each of PDUs 251 and 252 is capable of input power monitoring and, therefore, can measure and report the power that it draws from the upstream power chain that it is part of.

Data center 100 comprises servers 211, 212 and 213, which are mounted in rack 141, and servers 261, 262, 263, and 264, which are mounted in rack 142. For illustrative purposes, servers 211 through 213 are Windows™-enabled servers and servers 261 through 264 are UNIX™-enabled servers. As those who are skilled in the art will appreciate after reading this specification, however, other types of servers can also be present such as, while not being limited to, those running on Linux™, Solaris™, HP-UX™. Additionally, the servers depicted in FIG. 2 need not be identical to one another, even in regard to features other than the particular operating system that each server is running.

Power-monitoring appliances 221 and 271 each executes a power-monitoring program. Once such program is the Power IQ® program by Sunbird Software, Inc. This program can monitor the power consumption of tens of thousands of servers and present power usage information to an operator (e.g., a technician, etc.) via a web browser at asset management system 291. In some embodiments of the present invention, a single power-monitoring appliance can be associated with multiple racks, in contrast to each power-monitoring appliance corresponding to each rack as depicted.

Typically, a rack device that consumes electrical power, such as server 211 or power-monitoring appliance 221, is plugged into an available outlet on a rack PDU, using the device's power cable, which is also electrically connected to an onboard power supply of the device. At least some of the depicted rack devices have multiple, onboard power supplies, wherein each power supply has its own power cable and each power cable is plugged into an available outlet on a rack PDU. Where there are multiple power supplies that make up a given power-consuming device, the multiple power cables can be plugged into available outlets on the same rack PDU or can be plugged into available outlets on different rack PDUs (i.e., to achieve diversity in supply power).

Asset management system 291 executes one or more software programs that carry out a method in accordance with the illustrative embodiment, in addition to receiving and displaying information from one or more devices in racks 141 and 142. Asset management system 291 is described in more detail below and in regard to FIG. 4.

Within a data-networking context, local area network (LAN) 292 comprises equipment that connects servers 211 through 213 and 261 through 264 to one other and to power-monitoring appliances 221 and 271. A primary function of LAN 292 is to parcel out computing operations to the servers 211 through 213 and 261 through 264, and to make the results of such operations available to one or more systems (not shown).

In accordance with the illustrative embodiment, LAN 292 also supports the operation of PDUs 201, 202, 251, and 252, as well as other devices within data center 100, by providing a computer network that is capable of exchanging data amongst the devices that are connected to the LAN. In particular, LAN 292 conveys individual power consumptions of the servers 211 through 213 and 261 through 264, as measured by the rack PDUs, to power monitoring appliances 221 and 271. In some embodiments of the present invention, LAN 292 conveys power consumption as measured by other power-handling equipment, such as floor PDUs 111 through 114, to one or more power monitoring appliances. In some embodiments of the present invention, LAN 292 conveys power consumption information, as well as other information, directly to system 291.

The specific connectivity associated with LAN 292 is not described, nor does description provided herein specify the details of the computer network or networks used within data center 100, except where specifically required to describe or enable the present invention. Computer networks are well known and persons having skill in the art will be able to make and use such networks appropriate to the intended application.

In accordance with the illustrative embodiment, LAN 292 provides an Ethernet-based network. Alternatively, LAN 292 can provide a wireless network and/or can use protocols such as, while not being limited to, Simple Network Management Protocol (SNMP), Modbus, Intelligent Platform Management Interface (IPMI), and Transmission Control Protocol/Internet Protocol (TCP/IP).

Figure 3:
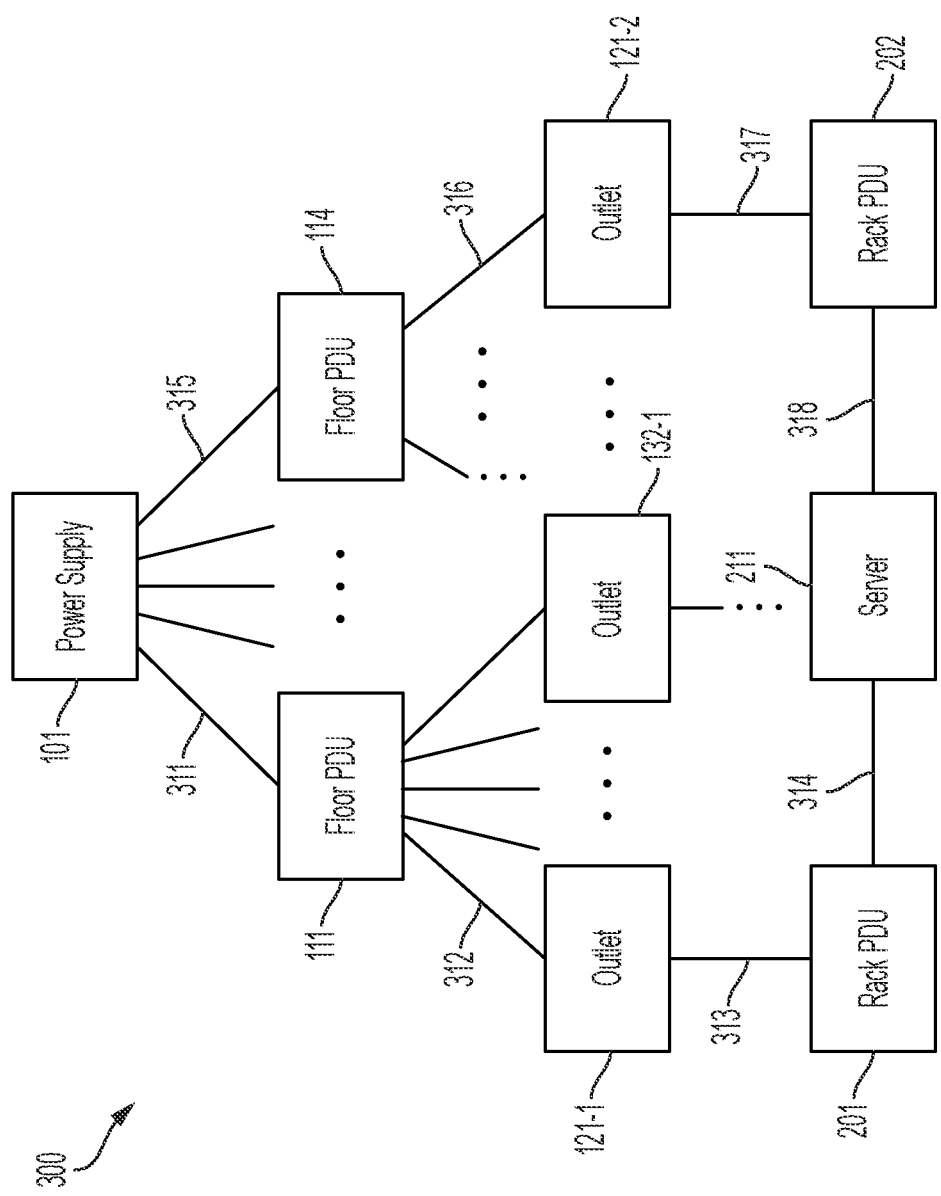
FIG. 3 depicts tree graph 300 that is representative of electrical power distribution throughout data center 100.

FIG. 3 depicts tree graph 300 that is representative of electrical power distribution throughout data center 100, in accordance with the illustrative embodiment. Graph 300 comprises vertices that correspond to the mains power supply, the floor PDUs, the power outlets, and the rack PDUs described above and in regard to FIGS. 1 and 2. For clarity purposes, only a subset of the equipment is depicted in FIG. 3.

The graph further comprises edges that correspond to electrical power paths. Specifically, each edge corresponds to a power path between a pair of vertices. As depicted and in a first power chain, power path 311 provides electrical power from power supply 101 to floor PDU 111, power path 312 provides electrical power from floor PDU 111 to outlet 121-1, power path 313 provides electrical power from outlet 121-1 to rack PDU 201, and power path 314 provides electrical power from rack PDU 201 to server 211 mounted in rack cabinet 141. In other words, the first power chain leading up to server 211 comprises the foregoing vertices and edges between power supply 101 and rack PDU 201, inclusive.

In the example illustrated, server 211 is being provided power by rack PDU 201 through power path 314. Server 211, having power redundancy, is also being provided power by rack PDU 202 through power path 318. In a second power chain that provides the power redundancy, power path 315 provides electrical power from power supply 101 to floor PDU 114, power path 316 provides electrical power from floor PDU 114 to outlet 121-2, power path 317 provides electrical power from outlet 121-2 to rack PDU 202, and power path 318, as already stated, provides redundant electrical power from rack PDU 202 to server 211. In other words, the second power chain leading up to server 211 comprises the foregoing vertices and edges between power supply 101 and rack PDU 202, inclusive.

Although server 211 is depicted as receiving its electrical power through two paths, those who are skilled in the art will appreciate, after reading this specification, that server 211 can receive its electrical power through a different number of paths (e.g., one, three, etc.) than depicted.

The depicted graph in FIG. 3 shows a particular configuration of vertices consuming and/or distributing electrical power and the edges along which electrical power is being supplied. As those who are skilled in the art will appreciate after reading this specification, however, some or all of the equipment units within data center 100 can be provided with electrical power in accordance with a different configuration than that depicted in FIG. 3. Furthermore, the depicted graph shows a particular set of equipment units at the vertices and a particular number of hierarchical levels in the graph. As those who are skilled in the art will appreciate after reading this specification, however, different types of equipment can be featured at one or more of the vertices, or a different number of levels can exist within a data-center equipment hierarchy represented in the graph, or both.

Figure 4:
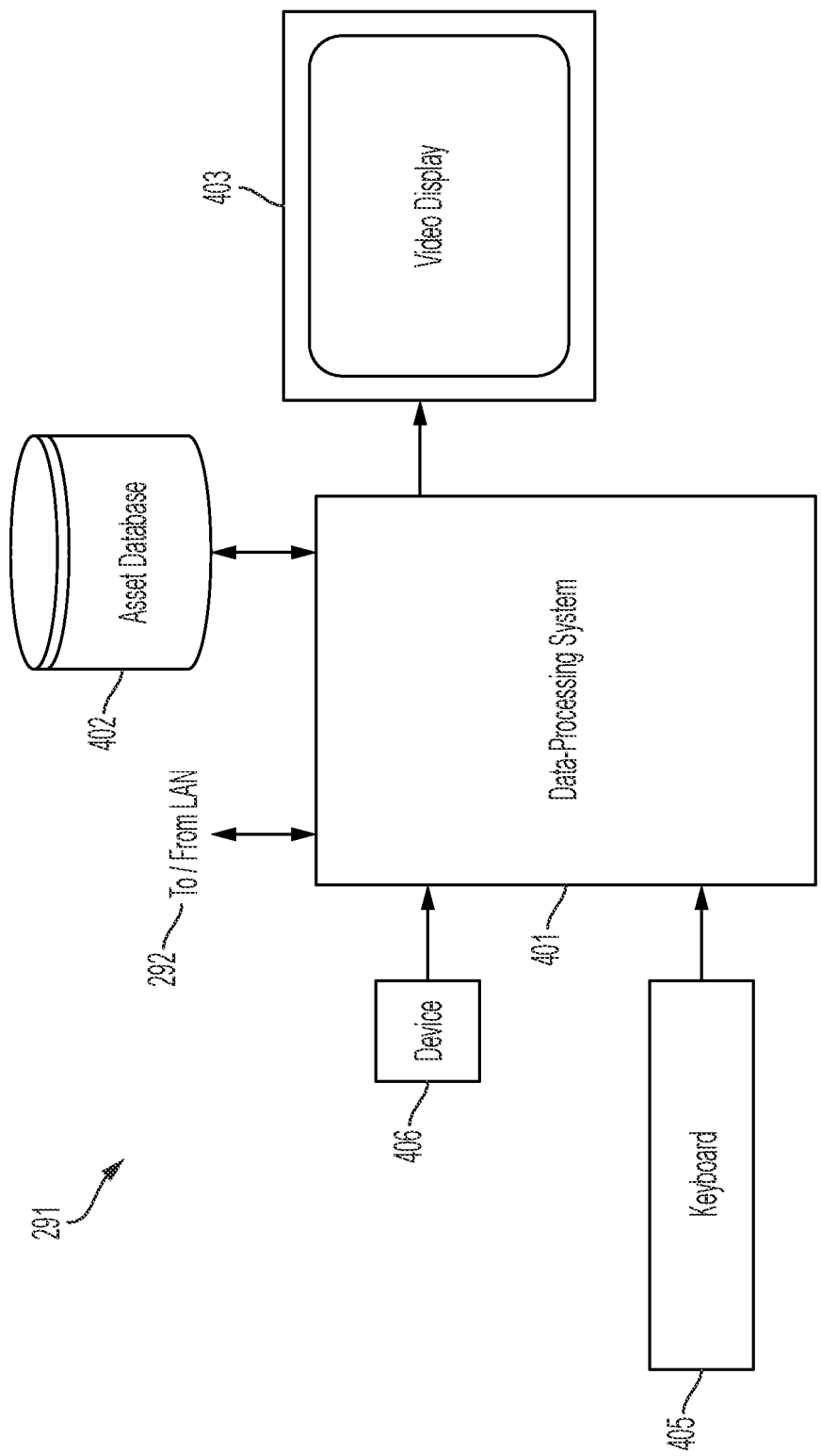
FIG. 4 depicts a block diagram of the salient components of power management system 291, including data-processing system 401.

FIG. 4 depicts a block diagram of the salient components of asset management system 291, in accordance with the illustrative embodiment. Asset management system 291 comprises: data-processing system 401, assets database 402, video display 403, keyboard 405, and pointing device 406, interconnected as shown.

Data-processing system 401 is a general-purpose computer that comprises a processor, memory, and input and output interfaces for an operator interface. Data-processing system 401 is capable of performing the operations described below. Data-processing system 401:

i. receives one or more datasets from, and updates one or more datasets stored in, assets database 402, and iii. receives a keyboard signal from keyboard 405, comprising an operator input control, and iii. receives a pointing and command signal from pointing device 406, comprising an operator input control, and iv outputs a video signal to video display 403 to present information to an operator, including one or more power paths with which to connect components to each other within data center 100 and/or one or more device positions within a group of rack cabinets at which to install a device.

Figure 5:
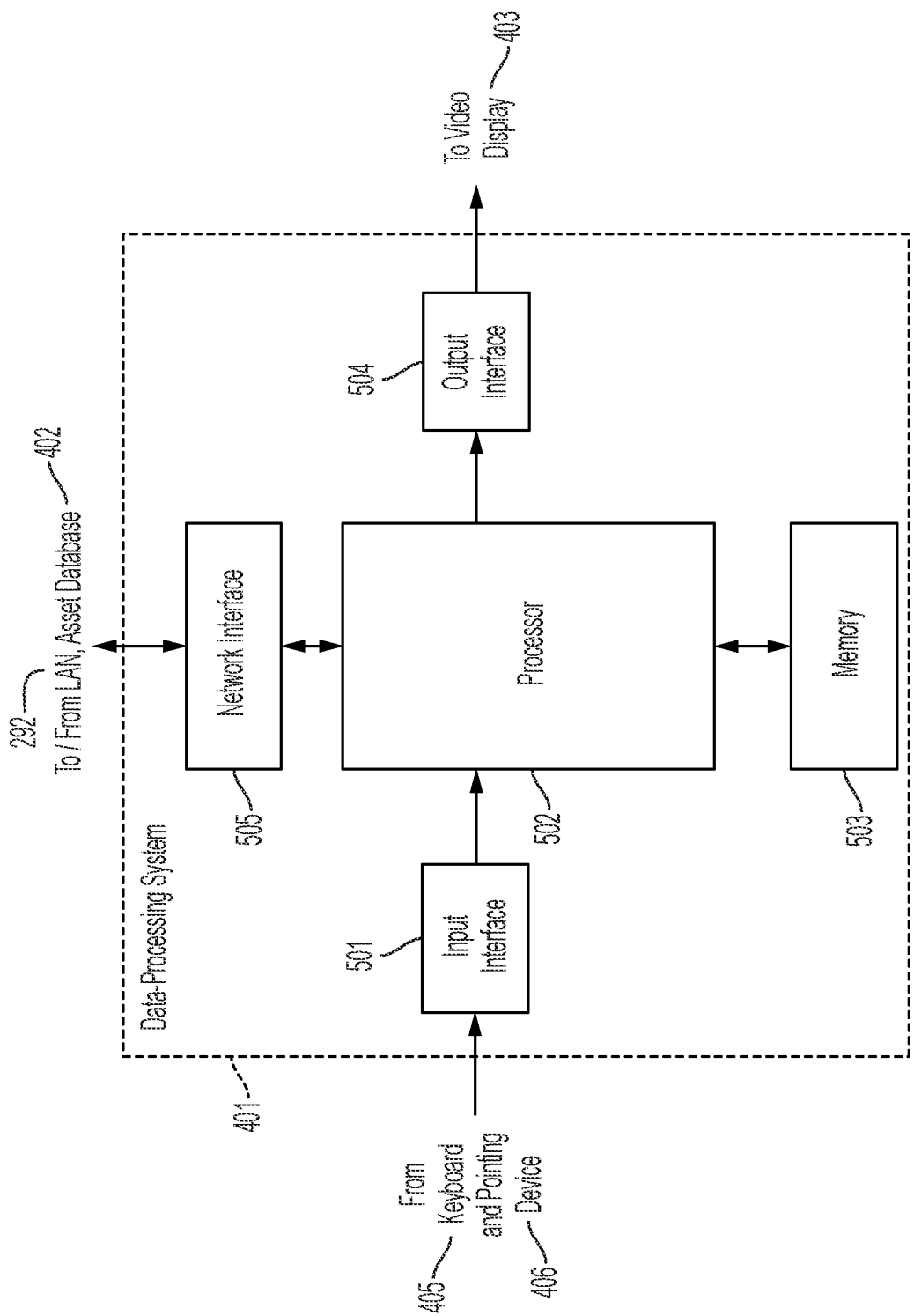
FIG. 5 depicts a block diagram of the salient components of data-processing system 401.

Data-processing system 401 is further depicted in FIG. 5.

Assets database 402 describes at least some characteristics of at least some of the assets within data center 100. The assets described within database 402 can include, for example and without limitation, identifiers of and/or one or more features of:

i. servers 211 through 213 and 261 through 264 (e.g., position within a cabinet, etc.), and ii. power monitoring appliances 221 and 271 (e.g., position within a cabinet, etc.), and iii. rack PDUs 201 through 204 (e.g., outlet configuration, voltage, amperage, phase, connector type, color code, etc.), and iv. power outlets 121-$h$ through 132-$h$, and v. rack cabinets 141 through 152 (e.g., dimensions, physical space, electrical space, type of equipment accepted by the rack cabinet, type of mounting that applies, etc.), and vi. floor PDUs 111 through 114 (e.g., voltage, amperage, phase, etc.), and vii. power supply 101 (e.g., voltage, amperage, phase, etc.).

Assets database 402 can describe other characteristics of other assets within data center 100, in addition to or different from those enumerated above.

In the illustrative embodiment of the invention, the attributes can also include a power management policy mapped to particular devices or device models. The power management policy includes a power budget for the device or models. The original power budget is typically based on the so-called nameplate power budget or the power budget specified by the manufacturer. It will be understood by data center operators that the actual power usage of a device requires less, and often much less, power than the nameplate power budget. A data center operator having read this disclosure will appreciate that the original power budget can be set at some percentage of the nameplate budget. It is desirable to set the power budget close to the actual power budget requirement of a device to minimize stranded capacity in the data center.

Figure 6:
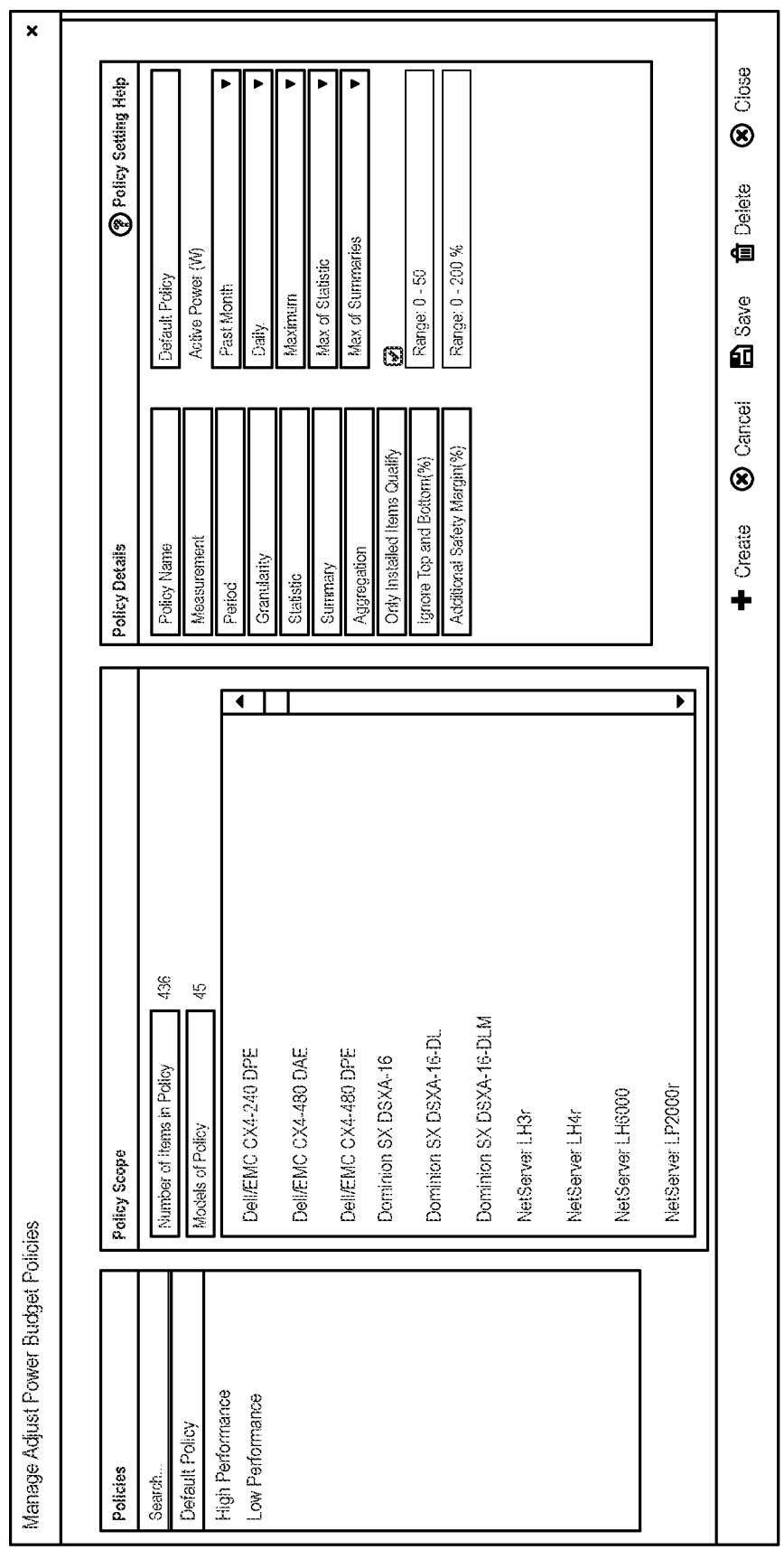
FIG. 6 depicts an interface display 600 that can be displayed on video display 403 using the system according to the invention.

As explained more particularly with respect to FIG. 6, in an aspect of a system and method according to the principles of the invention, the attributes and policies mapped to a device or models includes automatically adjusting the original power budget based on actual power usage data for a device such as device i. Automatically adjusting power budgets according to actual usage permits the data center operator to efficiently align actual power usage with budgeted power capacity and to reduce the time interval for adjusting budgets based on actual usage data. This permits the data center operator to allocate capacity efficiently to new or changed devices.

in one aspect of the invention, policy specifics are MEASUREMENT, PERIOD, GRANULARIY, STATISTIC, SUMMARY and AGGREGATION. MEASUREMENT indicates what is measured for the mapped device. In an illustrative policy, Active Power in watts is measured. PERIOD sets the time over which MEASUREMENT readings are collected and used for calculating a power budget. Exemplary periods can range from 1 day to 1 year, for example. GRANULARITY indicates what granularity of power data will be used for the budget calculations. Power measurements collected during polling cycles are rolled up into hourly, daily and monthly granularity tables. Depending on the PERIOD of a particular policy, the data center operator can choose whether to use hourly, daily or monthly power measurement as stored in a granularity table. If a policy sets the PERIOD to one day, then the data center operator can select hourly granularity. As the period increases to weekly or longer, then the operator can select less granular data collections.

STATISTIC aggregates the readings that occurred in the granularity time frame into a single value. The operator can select what statistic to aggregate. For example, the STATISTIC can be the average, maximum, minimum or another statistic that a skilled artisan would understand to be desirable after reading this disclosure. If the STATISTIC policy is set to average and granularity is set to daily, then the system returns the average of the day's readings.

SUMMARY aggregates all the measurements for a given period, granularity and statistic into a single value for each item. For example, a policy setting of a Past Week period with Daily granularity and a Maximum statistic yields 7 daily maximum readings. SUMMARY can be set to average, in which case the system averages the 7 daily maximum readings resulting in a single value. In an illustrative embodiment, the system automatically adjusts the power budget according to this single value.

In the exemplary embodiment, policies can also include a setting for directing the system to ignore certain power readings based on a percentage. If IGNORE TOP AND BOTTOM % is set to 1, for example, the system with throw out the top and bottom 1% of power readings from the SUMMARY calculations or from other calculations the operator may select. For example, values can be excluded for items before aggregating the items to calculate the power budget for a model. AGGREGATION FOR MODELS is a policy value that instructs the system to aggregate items comprising a device model into a single auto power budget for all the devices in a model, unless a particular device is excluded from the aggregation. Whether a device is excluded from a model aggregation can be part of the auto power budget policy for the device.

HEADROOM in an exemplary embodiment is a percentage value multiplied with the SUMMARY value for an item. This multiplication yields the power budget for the item. For example, if the SUMMARY value equals 100 Watts and the operator has selected 120% HEADROOM, then the automatically calculated power budget for the item is 120 Watts.

An exemplary policy setting can also include a selection indicating what items qualify for inclusion for the automatic power budget calculation. ONLY INSTALLED ITEMS QUALIFY lets the operator limit the calculation to items that have an installed status longer than the selected PERIOD. So if the PERIOD is set to monthly, items installed less than a month will not be included. If unselected, then all items, including items planned for installation and planned for decommission are included in the calculation. A skilled artisan after reading this disclosure that this is merely exemplary and that an operator can choose to exclude or include items based on installation status in other ways without departing from the principles of the invention.

In accordance with the above, consider the following exemplary policy that may be stored in the database:

TABLE

| Policy Attribute | Value |
| --- | --- |
| NAME | Default |
| PERIOD | Past Year |
| GRANULARITY | Daily |
| STATISTIC | Maximum |
| SUMMARY FOR ITEMS | Average |
| AGGREGATION FOR MODELS | Maximum |
| IGNORE TOP AND BOTTOM(%) | 5 |
| HEADROOM(%) | 15 |
| ONLY INSTALLED ITEMS QUALIFTY | Check |

Assume an operator has assigned the Default Policy to Model A servers. The data base holds 140 items identified as Model A servers. The data base further indicates that 100 of the Model A servers have an installed status of 12 months or more. A system according to the invention applying the Default Policy collects power data readings from the data base for the 100 items over the past year. Each item has 365 daily maximum readings. Eighteen of the highest and lowest readings are discarded according to the policy percentage. The system averages the remaining 329 readings for each item. The average value is multiplied by the headroom percentage. The result for each item is used to calculate a power budget for each item. These 100 values are used to calculate the auto power budget for Model A. In this calculation, the lowest and highest 5 values are discarded, leaving 90 items for the calculation. Applying the maximum aggregation policy, the highest of the 90 values is used as the automatic power budget value for Model A.

Video display 403 is a display device (e.g., a monitor, etc.) as is well known in the art that receives a video signal and creates a visual image of the signal for presentation to an operator. In accordance with the illustrative embodiment, display 403 receives the signals that are generated as described below and presents the information to the operator. It will be clear to those skilled in the art, after reading this specification, how to make and use video display 403.

Keyboard 405 is a character input device as is well known in the art that receives input from an operator and transmits keyboard signals representing that input. It will be clear to those skilled in the art, after reading this specification, how to make and use keyboard 405.

Pointing device 406 is a spatial input device (e.g., a mouse, a joystick, a touchpad, a stylus, etc.) as is well known in the art that receives spatial and command (e.g., button, wheel, etc.) input from an operator and that transmits pointing and command signals representing that input. It will be clear to those skilled in the art, after reading this specification, how to make and use pointing device 406.

In accordance with the illustrative embodiment, asset management system 291 performs at least some of the operations described below. As those who are skilled in the art will appreciate after reading this specification, however, a different system can perform some or all of said operations.

FIG. 5 depicts a block diagram of the salient components of data-processing system 401, in accordance with the illustrative embodiment. Data-processing system 401 is a computing device and comprises input interface 501, processor 502, memory 503, output interface 504, and network interface 505 interconnected as shown. In accordance with the illustrative embodiment, data-processing system 401 is a personal computer.

Input interface 501 (e.g., a USB interface, etc.) receives signals from keyboard 405 and pointing device 406, and forwards the information encoded in the signals to processor 502. It will be clear to those skilled in the art, after reading this specification, how to make and use input interface 501.

Processor 502 is a general-purpose processor that is capable of, in accordance with the operations described in regard to FIGS. 6 through 9: receiving information from input interface 501; reading data from and writing data into memory 503; executing at least some of the operations described below; and transmitting information to output interface 504 (e.g., browser-related information, etc.). In some alternative embodiments of the present invention, processor 502 might be or might comprise a special-purpose processor, such as a graphics-processing unit (GPU). In either case, it will be clear to those skilled in the art, after reading this specification, how to make and use processor 502.

Memory 503 stores data and executable instructions, is a combination of volatile and non-volatile memory, and is non-transitory. It will be clear to those skilled in the art, after reading this specification, how to make and use memory 503.

Output interface 504 (e.g., a USB interface, etc.) receives information from processor 502, and outputs signals that encode this information to video display 403. In some embodiments, output interface 504 can be built into a video card, which can be used to offload at least some of the processing from processor 502. It will be clear to those skilled in the art, after reading this specification, how to make and use output interface 504.

Network interface 505 receives one or more datasets from assets database 402. In some alternative embodiments of the present invention, the datasets are made available to data-processing system 401 through other means. Network interface 505 transmits one or more updated datasets to assets database 402. Interface 505 also communicates via LAN 292 to one or more rack-mounted devices and other devices within data center 100. It will be clear to those skilled in the art, after reading this specification, how to make and use network interface 505.

As those who are skilled in the art will appreciate after reading this specification, the hardware platform performing at least some of the operations performed by data-processing system 401 can be embodied as a multi-processor platform, as a sub-component of a larger computing platform, as a virtual computing element, or in some other computing environment—all within the scope of the present invention. The steps described herein can be performed in a single processor, or distributed across multiple processors. Furthermore, data-processing system 401 can be a type of apparatus different than a personal computer, such as a server computer, and can be referred to by a different name such as a computer system, a computing device, or another type of hardware platform that comprises one or more processors, one or more memories, and one or more network interfaces, for example and without limitation.

In accordance with the illustrative embodiment, data-processing system 401 runs at least some of the software associated with PowerIQ® and dcTrack® by Sunbird Software, Inc. in order to provide at least some of the assets database functionality.

FIG. 6 depicts an interface display 600 that can be displayed on video display 403 using the system according to the invention. The display 600 comprises input fields for power budget policies. The interactive interface 600 comprises fields for policy names, policy scope and policy details. The exemplary policy names are Default, High Performance and Low Performance. The policy scope includes the items and the model in the policy. The policy details indicate the attributes of the policy as identified above. As the interface is interactive, the operator can configure auto power budgeting by selecting policies from the policy names and inputting the items to be covered by the policy. The policy details are configurable as previously explained.

In this example, the Default policy is configured for moderate headroom and safety. Low performance policies would provide for greater headroom and for less adjustments to the power budget. For high performance, the operator configures the policy details to achieve a high performance data center, in part by minimizing the excess capacity budgeted for items and models.

In an exemplary embodiment, the possible values for Period are Daily, Weekly, Monthly, Past 60 Days, Past 90 Days and Past Year. The Period can be other values or customizable. The possible values for Granularity include the same values for Period plus Hourly. As previously explained, the Granularity value should not be a longer interval than the selected Period. Values for Statistic, Summary and Aggregation are Average and Maximum. In the exemplary embodiment, these values are selectable via dropdown menus in the interactive interface.

Figure 7:
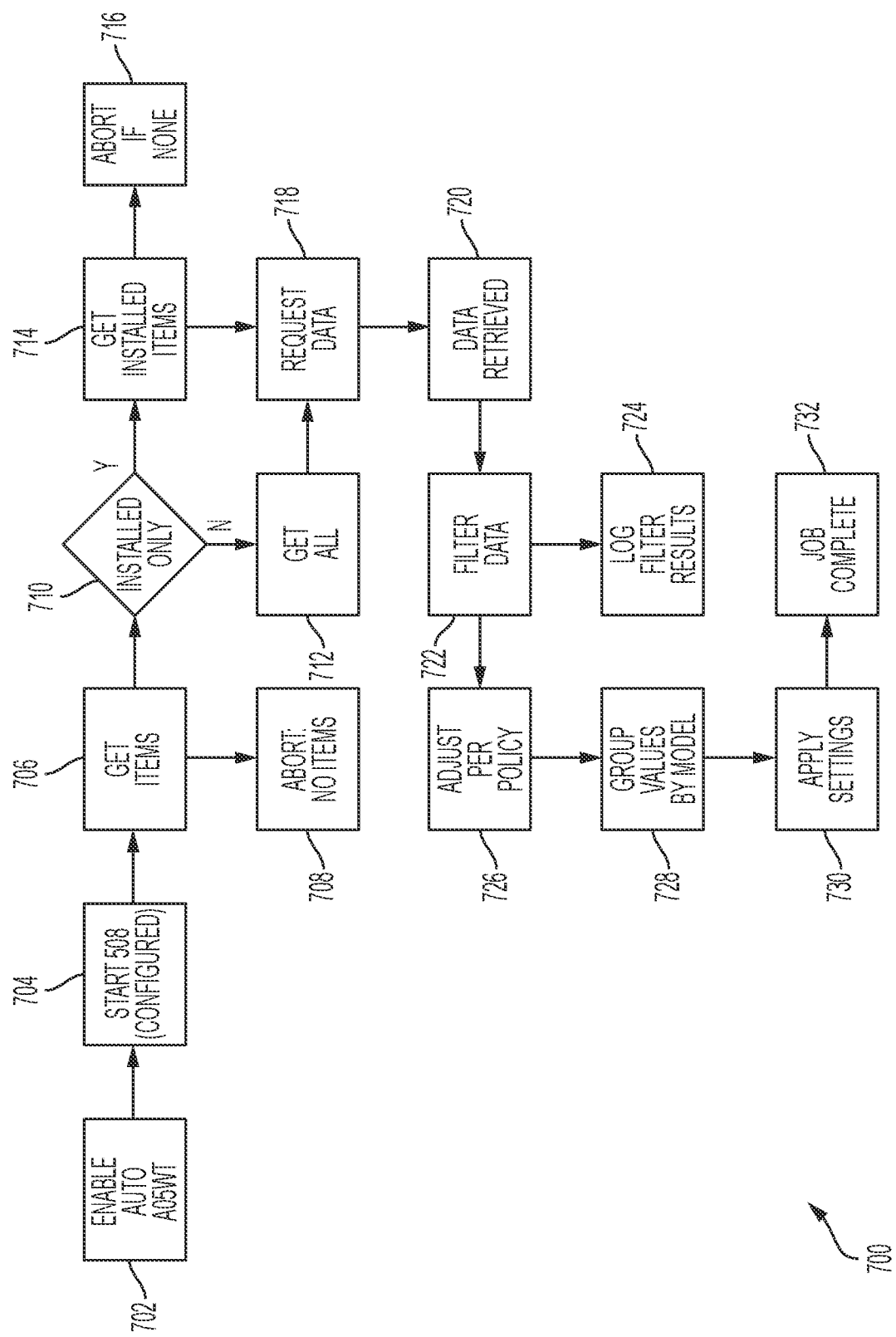
FIG. 7 depicts a flowchart of the salient processes of method 700 for implementing automatically power budgeting according to the principles of the invention.

FIG. 7 depicts a flowchart of the salient processes of method 700 for implementing automatically power budgeting according to the principles of the invention. It will be clear to those having ordinary skill in the art, after reading the present disclosure, how to make and use alternative embodiments of method 700, as well as the other methods disclosed in this specification, wherein the operations, sub-operations, and messages are differently sequenced, grouped, or sub-divided—all within the scope of the present disclosure. It will be further clear to those skilled in the art, after reading the present disclosure, how to make and use alternative embodiments of the disclosed methods wherein some of the described operations, sub-operations, and messages are optional, are omitted, or are performed by other elements and/or systems.

For pedagogical purposes, the operations associated with the disclosed system and method are presented as being sequentially performed. As those who are skilled in the art will appreciate after reading this specification, at least some of the operations disclosed herein can be performed in parallel with one another.

The power budgeting techniques disclosed in FIG. 7 and related figures are depicted as being performed by data-processing system 401 within asset management system 291. As those who are skilled in the art will appreciate after reading this specification, however, these disclosed techniques can be performed elsewhere.

Data-processing system 401 initializes database 402, which describes at least some characteristics of at least some of the assets within data center 100, including power budgets and power budgeting policies as previously described. System 401 initializes assets database 402 to store a current description of some or all of the identifiers and features listed above and in regard to the description of database 402 in FIG. 4.

Database 402, in some embodiments, is initialized to map items and models to policies as may have been configured by the operator as previously described. In some embodiments of the present invention, assets database 402 is configured manually. In other embodiments data-processing system 401 can import a spreadsheet or other type of computer file that describes one or more aspects of the equipment configuration within data center 100, including the power budget policies associated with items and models as described.

In accordance with operation 702, data-processing system 401 receives an indication that the power budget auto adjust feature is enabled. At operation 704, the system 401 initiates an auto power adjust job at a previously configured time, preferably periodically. The job can also be initiated manually by the operator.

In operation 706, the system 401 retrieves all the items and models identified with the policy job in operation. In the exemplary embodiment, the data associated with the items and models are stored in database 402. Optionally, the system may filter items lacking appropriate data attributes for carrying out the method, such as lacking identifiers. If there are no items returned for the job, the system 401 aborts the job as at 708.

Decision operation 710 determines whether the policy includes only installed items in the power adjust calculation. If all items are included, the system 401 identifies all items having the policy under calculation at operation 712. Otherwise, only installed items are identified, as at operation 714. If there are no installed items, the system 401 aborts the job at operation 716.

The system 401 queries database 402 for the power reading data for each identified item according to the policy settings and retrieves the data from the database 402, as at operations 718 and 720. The returned data can be further filtered, as at 722. Filtering can optionally include exclude items that lack a power reading where a reading would be expected, such as an oldest day reading for items that have never been adjusted either manually or automatically. A person having ordinary skill in the art will understand after reading this disclosure how to filter data so as to provide optimized results. If the system 401 filters items in this operation, the system optionally logs the filter results at operation 724.

In accordance with operation 726, the system 401 applies the policy calculations as explained with respect to FIGS. 4 to 6. The calculations yield the auto power budget for each item. The resulting values are grouped by model in accordance with operation 728. The system applies the ignore top and bottom setting and calculates an aggregated value for each model as previously explained, as at operation 730. This completes the job, as at operation 732.

Figure 8:
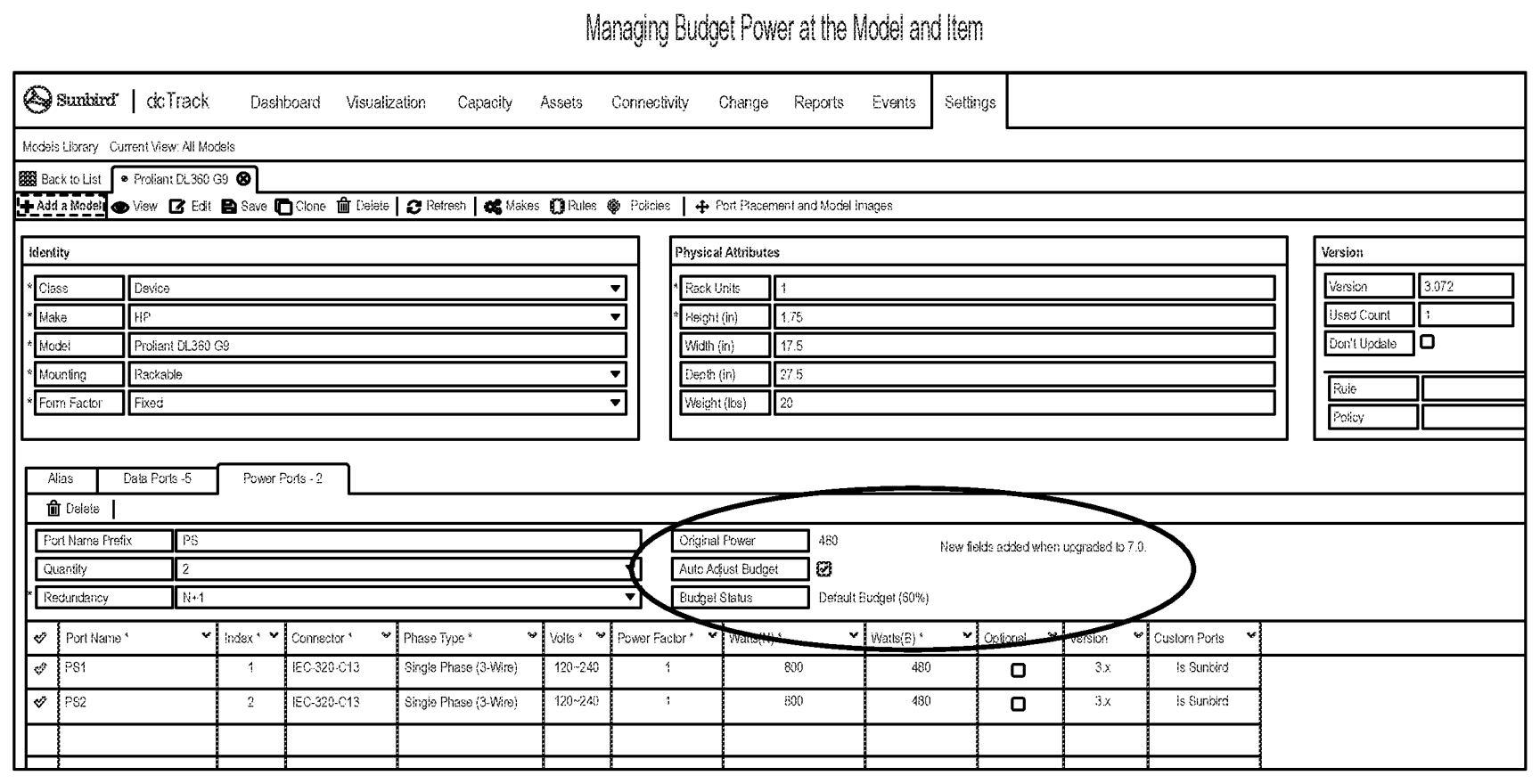

FIG. 8 depicts an interactive interface 800 for providing inputs and for receiving information relative to the system and method of the invention. In this interface, the operator interacts with the system so as to provide configuration data for power budget managing of particular models and items.

The Original Power field stores the value of the power budget before the power budget is automatically adjusted. For reporting purposes, the system can report the stranded watts reclaimed from each device due to using this feature by taking the difference between the Original Power and the Adjusted Power. Also, if the operator wishes to override the auto power budget adjustment, the operator can revert to the original value.

The Auto Adjust Budget field is a Boolean field that allows the user to opt out the model and/or the item from being auto adjusted by this feature. Exemplary uses cases include where the operator adds a model to a policy but wishes to exclude particular items in the model group from auto adjustment. The operator implements the use case with this field.

Another use case includes where the operator desires the system to auto adjust all the items of a particular server, but does not want the system to auto adjust the model based on the aggregate of the 100 servers. The operator can implement the use case with the features on the interface. A combination of both uses cases can also be selected.

The Budget Status field tracks and informs the operator about the Power Budget value. There are at least three possible values for this field:
 Manually Adjusted—a user manually change the Power Budget
 Auto Adjusted—the Power Budget was changed by Auto Power Budget process
 Default Budget—never been adjusted manually or automatically In all above cases, the system displays a percentage of the Power Budget from the Nameplate Power Rating—shown as Watts (N) in the table.

What is claimed is:

1. A method for determining an auto power budget policy for a group of data center equipment comprising:
 grouping ones of data center equipment according to model;
 determining which of the data center equipment to include in an auto power budget policy calculation;
 measuring periodically a maximum of actual power usage for ones of the data center equipment;
 discarding certain of the maximum actual power measurements from the auto power budget policy calculation according to configured criteria;
 averaging an undiscarded maximum actual power measurements for each of the ones of data center equipment included in the auto power budget policy calculation;
 multiplying the averages by a headroom value to determine a power budget for each of the ones of data center equipment;
 averaging the power budgets for each of the ones of data center equipment; and
 assigning the averaged power budget as the auto power budget policy for the model.

2. The method of claim 1 wherein the determining step includes only installed data center equipment.

3. The method of claim 1 wherein measuring periodically includes configuring at least one of hourly, daily, weekly or monthly as a period.

4. The method of claim 1 further comprising selectively excluding data center equipment from the assigned auto power budget policy.

5. The method of claim 1 further comprising maintaining statistics related to actual power usage for the data center equipment.

6. A system for managing power in a data center including a plurality of data center assets, the system comprising:
- a plurality of power measurement devices configured to periodically measure power usage of ones of the data center assets;
- an assets database configured to store data describing attributes of the data center assets, including data center asset identifiers having model identifiers, power management policies having power budgets, power usage measurements received from the power measurement devices, and data mapping the power management policies to the data center assets;
- a data processing unit configured (1) to store in the data base power usage measurements received from the power measurement devices for ones of the data center assets having common model identifiers, (2) to retrieve the attributes of the ones of data center assets from the assets database, (3) to determine respective maximums of the power usage measurements for the ones of data center assets for given periods, (3) to average the respective maximums for the ones of data center assets, (4) to multiply the respective averages by a configurable headroom value to determine respective power budgets for the ones of data center assets, (5) to average the respective power budgets for the ones of data center assets, and (6) to assign the averaged power budget to the power management policy for the data center assets having the common model identifier.

7. The system of claim 6 further comprising a user interface including a visual display and at least one input device, the user interface in data communication with the data processing unit, wherein the data processing system causes the visual display to display values indicative of differences between the averaged power budgets and the power budgets.

8. The system of claim 7 wherein the power management policies further include data indicating a measurand for the power measurement devices, a time period over which the power measurement devices measure power usage, a granularity of measurement over the time period, at least one statistical aggregation of the measurements in a period, and the heardroom value.

9. The system of claim 7 wherein the statistical aggregation includes a maximum.

10. The system of claim 9 wherein the power management policies further include data indicative of an average of the statistical aggregations over a given period.

\* \* \* \* \*